(12) United States Patent
Liu et al.

(10) Patent No.: US 11,796,578 B2
(45) Date of Patent: Oct. 24, 2023

(54) INSULATION DETECTION CIRCUIT FOR VOLTAGE BALANCE

(71) Applicant: JEE AUTOMATION EQUIPMENT (SHANGHAI) CO., LTD., Shanghai (CN)

(72) Inventors: Lei Liu, Shanghai (CN); Hui Yang, Shanghai (CN); Lin Zhang, Shanghai (CN); Yanqi Guo, Shanghai (CN)

(73) Assignee: JEE AUTOMATION EQUIPMENT (SHANGHAI) CO., LTD., Shanghai (CN)

( * ) Notice: Subject to any disclaimer, the term of this patent is extended or adjusted under 35 U.S.C. 154(b) by 39 days.

(21) Appl. No.: 17/699,423

(22) Filed: Mar. 21, 2022

(65) Prior Publication Data

US 2022/0214388 A1 Jul. 7, 2022

Related U.S. Application Data

(63) Continuation of application No. PCT/CN2020/140696, filed on Dec. 29, 2020.

(30) Foreign Application Priority Data

Oct. 28, 2020 (CN) .......................... 202011167891.1

(51) Int. Cl.
*G01R 27/00* (2006.01)
*G01R 27/02* (2006.01)
*G01R 31/14* (2006.01)

(52) U.S. Cl.
CPC ........... *G01R 27/025* (2013.01); *G01R 31/14* (2013.01)

(58) Field of Classification Search
CPC .............................. G01R 31/00; G01R 27/025
(Continued)

(56) References Cited

U.S. PATENT DOCUMENTS

2015/0130471 A1\* 5/2015 Bolduc .............. G01R 31/3835
324/427
2019/0064279 A1 2/2019 Dan et al.

FOREIGN PATENT DOCUMENTS

CN 108614158 A 10/2018
CN 109031061 A 12/2018
(Continued)

OTHER PUBLICATIONS

International Search Report and Written Opinion issued in corresponding PCT Application No. PCT/CN2020/140696, dated Jun. 29, 2021.

*Primary Examiner* — Vincent Q Nguyen
(74) *Attorney, Agent, or Firm* — Westbridge IP LLC

(57) ABSTRACT

Disclosed is an insulation detection circuit for voltage balance, including a bus battery, a bus positive voltage dividing circuit, a bus negative voltage dividing circuit, a differential amplification circuit and a micro controller unit (MCU) module. The bus battery is respectively connected with the bus positive voltage dividing circuit and the bus negative voltage dividing circuit, the bus positive voltage dividing circuit and the bus negative voltage dividing circuit is respectively connected with the differential amplification circuit, and the differential amplification circuit being connected with the MCU module; the bus battery is configured for supplying power to each module; the bus positive voltage dividing circuit is configured for converting a positive voltage of the bus from high voltage to detectable low voltage; the bus negative voltage dividing circuit is configured for converting a negative voltage the bus from high voltage to detectable low voltage.

3 Claims, 1 Drawing Sheet

(58) Field of Classification Search
USPC .......................................... 324/509, 551, 557
See application file for complete search history.

(56) References Cited

FOREIGN PATENT DOCUMENTS

| | | |
|---|---|---|
| CN | 109720235 A | 5/2019 |
| CN | 110095651 A | 8/2019 |
| CN | 111505380 A | 8/2020 |

* cited by examiner

INSULATION DETECTION CIRCUIT FOR VOLTAGE BALANCE

CROSS-REFERENCE TO RELATED APPLICATIONS

This application is a continuation of International Application No. PCT/CN2020/140696, filed on Dec. 29, 2020, which claims priority to Chinese Patent Application No. 202011167891.1, filed on Oct. 28, 2020. The disclosures of the above-mentioned applications are incorporated herein by reference in their entireties.

TECHNICAL FIELD

The present application belongs to a technical field of power batteries, and particularly relates to an insulation detection circuit for voltage balance.

BACKGROUND

Due to the rapid development of new energy vehicles, the standard for performance of automotive electronics is becoming higher and higher, especially the safety protection strategy of motor to controller is more and more strict. When the new energy vehicle is loaded with a high-voltage battery in real time, the high-voltage insulation problem will be involved because of the existence of high voltage The positive pole or negative pole of the bus forms a current circuit with the vehicle by passing through the insulation layer. When the insulation performance decreases, the leakage current will increase. When the leakage current reaches a certain value, it will endanger personal safety and the operation of the electrical system of the vehicle. At present, the commonly used insulation detection methods include a high voltage signal injection method, and an insulation detection method based on international standard IOS16750 and China standard GB-T18488. In order to reduce the generation of leakage current, a large insulation resistor is required, and in order to ensure the accuracy of the detection process, it is necessary to ensure that an input voltage of the microcontroller unit (MCU) chip is within the detectable range.

In the current insulation detection circuit for voltage balance, a relationship between two insulation resistors is obtained by connecting the insulation resistor and a voltage dividing resistor in series, and turning on and off the switch for many times. A sampling resistor is used to transmit the sampling signal to the MCU for voltage detection, so as to realize the insulation detection. Using this scheme, it is required to use a small insulation resistor, which has a risk of not meeting the national or international standards. In this scheme, the switch is controlled to turn on and off for many times to determine a relationship between the insulation resistors, and the detection cycle is long; and the insulation resistor between the positive pole and negative pole of the bus cannot be determined, and cannot achieve bus voltage balance.

SUMMARY

An insulation detection circuit for voltage balance is provided. The existing resources of MCU are reasonably used to design the insulation detection circuit for voltage balance. The positive pole and negative pole of the bus are connected with a common ground through the resistors of the same resistance to realize voltage balance of the bus.

On one aspect, it provides an insulation detection circuit for voltage balance, comprising a bus battery, a bus positive voltage dividing circuit, a bus negative voltage dividing circuit, a differential amplification circuit and a MCU module;

where the bus battery is connected with the bus positive voltage dividing circuit and the bus negative voltage dividing circuit, the bus positive voltage dividing circuit and the bus negative voltage dividing circuit are connected with the differential amplification circuit, and the differential amplification circuit is connected with the MCU module;

the bus battery is configured for supplying power to each module;

the bus positive voltage dividing circuit is configured for converting a positive voltage of the bus from a high voltage to a detectable low voltage;

the bus negative voltage dividing circuit is configured for converting a negative voltage of the bus from a high voltage to a detectable low voltage;

the differential amplification circuit is configured for sampling a voltage dividing signal, amplifying the sampled voltage dividing signal and transmitting the amplified voltage dividing signal to the MCU module;

the MCU module is configured for an insulation detection of a bus.

According to any possible implementation of the above scheme, further, the bus battery includes a battery, a first capacitor and a second capacitor, and the bus positive voltage dividing circuit comprises a first resistor and a second resistor, the bus negative voltage dividing circuit comprises a third resistor and a fourth resistor, and the differential amplification circuit comprises a first amplifier, a second amplifier, a fifth resistor, a sixth resistor, a seventh resistor, an eighth resistor, a ninth resistor, a tenth resistor and an eleventh resistor; and the MCU module comprises a MCU processing chip;

resistance values of the first resistor and the third resistor are the same; a resistance value of the second resistor is less than that of the first resistor, and a resistance value of the fourth resistor is less than that of the third resistor;

a positive pole of the battery is connected with a first terminal of the first capacitance and a first terminal of the first resistor, a negative pole of the battery is connected with a first terminal of the second capacitance and a first terminal of the third resistor, and a second terminal of the first capacitance is connected with a second terminal of the second capacitance, a first terminal of the second resistor, a first terminal of the fourth resistor, a first terminal of the fifth resistor, a first terminal of the tenth resistor and a first terminal of the eleventh resistor and grounded, and a second terminal of the first resistor is connected with a second terminal of the second resistor and a first terminal of the seventh resistor, a second terminal of the seventh resistor is connected with a non-inverting input terminal of the first amplifier, and a second terminal of the fifth resistor is connected with an inverting input terminal of the first amplifier and a first terminal of the sixth resistor, a second terminal of the sixth resistor is connected with an output terminal of the first amplifier and a first analog to digital converter (ADC) port of the MCU processing chip, and a second terminal of the third resistor is connected with a second terminal of the fourth resistor and a first terminal of the ninth resistor, a second terminal of the ninth resistor is connected with an non-inverting input terminal of the second amplifier and a first terminal of the eighth resistor, a second terminal of the eighth resistor is connected with a power supply of 2.5V, and a second terminal of the tenth resistor is connected with an inverting input terminal of the second amplifier, a second terminal of the eleventh resistor is connected with an output terminal of the second amplifier and a second ADC port of the MCU processing chip.

According to any possible implementation of the above scheme, further, amplification factors of the first amplifier and the second amplifier are adjusted through the fifth resistor, the sixth resistor, the seventh resistor, the eighth resistor, the ninth resistor, the tenth resistor and the eleventh resistor.

According to any possible implementation of the above scheme, further, the amplification factors of the first amplifier and the second amplifier are the same or different, so that the positive and negative voltage sampling signal are within the detectable range of 0~5V of the MCU processing chip after differential amplification.

By making rational use of the existing resources of MCU, the insulation detection circuit to realize voltage balance is designed, and the positive pole and negative pole of the bus are connected to the common ground through the resistors of the same resistance to realize voltage balance of the bus. By increasing the resistance of the insulation resistor, the insulation performance of the circuit is effectively guaranteed. At the same time, the proportional amplification resistance is increased in the comparator to make the voltage of the insulation detection signal within the detection range of MCU chip and ensure the detection accuracy. At the same time, the real-time detection method is adopted to ensure the real-time safety and effectiveness of the system.

BRIEF DESCRIPTION OF THE DRAWINGS

The following is further described in combination with the accompanying drawings and the embodiments.

DETAILED DESCRIPTION OF THE EMBODIMENTS

Figure 1:
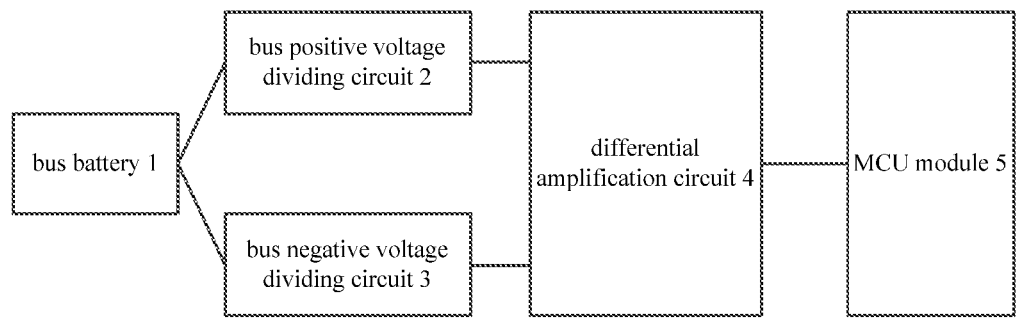
FIG. 1 is a structural block diagram of an insulation detection circuit for voltage balance provided by the present application.
Figure 2:
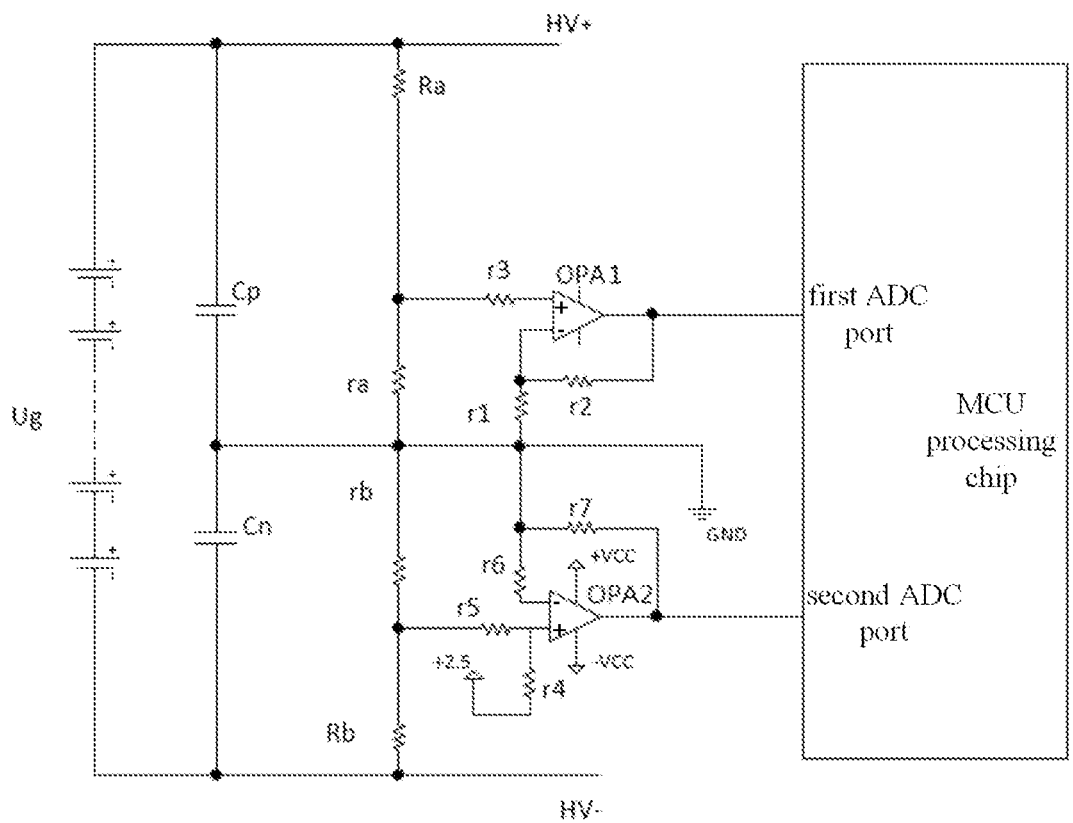
FIG. 2 is a circuit schematic diagram of the insulation detection circuit for voltage balance provided by the present application.

Embodiment: the present application provides an insulation detection circuit for voltage balance. Referring to FIGS. 1-2, the insulation detection circuit includes: a bus battery 1, a bus positive voltage dividing circuit 2, a bus negative voltage dividing circuit 3, a differential amplification circuit 4 and a MCU module 5.

The bus battery 1 is connected with the bus positive voltage dividing circuit 2 and the bus negative voltage dividing circuit 3, the bus positive voltage dividing circuit 2 and the bus negative voltage dividing circuit 3 are connected with the differential amplification circuit 4, and the differential amplification circuit 4 is connected with the MCU module 5. The bus battery 1 is configured for supplying power to each module; the bus positive voltage dividing circuit 2 is configured for converting a positive voltage of a bus from a high voltage to a detectable low voltage; the bus negative voltage dividing circuit 3 is configured for converting a negative voltage of the bus from a high voltage to a detectable low voltage; the differential amplification circuit 4 configured for sampling a voltage dividing signal, amplifying the sampled voltage dividing signal and transmitting the amplified voltage dividing signal to the MCU module 5; and the MCU module 5 is configured for an insulation detection of the bus.

For example, with regard to the detectable low voltage, the detectable low voltage in a 5V system is 0~5V, and the detectable low voltage in a 3.3V system is 0~3.3V.

As shown in FIG. 2, the bus battery 1 includes a battery Ug, a first capacitor Cp and a second capacitor Cn, the bus positive voltage dividing circuit 2 includes a first resistor Ra and a second resistor ra, the bus negative voltage dividing circuit 3 includes a third resistor Rb and a fourth resistor rb, and the differential amplification circuit 4 includes a first amplifier OPA1, a second amplifier OPA2, a fifth resistor r1, a sixth resistor r2, a seventh resistor r3, an eighth resistor r4, a ninth resistor r5, a tenth resistor r6 and an eleventh resistor r7; and the MCU module 5 includes MCU processing chip.

The resistance values of the first resistor Ra and the third resistor Rb are the same; the resistance value of the second resistor Ra is much less than that of the first resistor Ra, and the resistance value of the fourth resistor rb is much less than that of the third resistor Rb. In this application, it is ensured that an insulation resistor between the positive pole and negative pole is equal (i.e., Ra=Rb), and the resistance value of the sampling resistor is very small relative to the insulation resistor (that is, ra≈rb<<Ra). The positive pole and negative pole of the bus are connected to the common ground through the resistors of the same total resistance (that is, Ra+ra≈Rb+rb), so as to realize voltage balance of the bus.

The positive pole of the battery Ug is respectively connected with a first terminal of the first capacitor Cp and a first terminal of the first resistor Ra, a negative pole of the battery Ug is connected with a first terminal of the second capacitor Cn and a first terminal of the third resistor Rb, and a second terminal of the first capacitor Cp is connected with a second terminal of the second capacitor Cn, a first terminal of the second resistor Ra, a first terminal of the fourth resistor rb and a first terminal of the fifth resistor r1, a first terminal of the tenth resistor r6 and a first terminal of the eleventh resistor r7 and grounded, a second terminal of the first resistor Ra is connected with a second terminal of the second resistor ra and a first terminal of the seventh resistor r3, a second terminal of the seventh resistor r3 is connected with an non-inverting input terminal of the first amplifier OPA1, and a second terminal of the fifth resistor r1 is connected with an inverting input terminal of the first amplifier OPA1 and a first terminal of the sixth resistor r2, a second terminal of the sixth resistor r2 is connected with an output terminal of the first amplifier OPA1 and a first analog to digital converter (ADC) port of the MCU processing chip, a second terminal of the third resistor Rb is connected with a second terminal of the fourth resistor rb and a first terminal of the ninth resistor r5, and a second terminal of the ninth resistor r5 is connected with an non-inverting input terminal of the second amplifier OPA2 and a first terminal of the eighth resistor r4, a second terminal of the eighth resistor r4 is connected with a power supply of 2.5V, a second terminal of the tenth resistor r6 is connected with an inverting input terminal of the second amplifier OPA2, and a second terminal of the eleventh resistor r7 is connected with an output terminal of the second amplifier OPA2 and a second ADC port of the MCU processing chip.

The sampling resistors r3 and r5 are configured to detect the voltages of the voltage dividing resistors ra and rb. The differential amplification method of amplifier is adopted to ensure that the positive and negative voltage sampling signals are within the detectable range (0~5V) of the MCU after being differential amplified, so as to realize the insulation detection.

Optionally, amplification factors of the first amplifier OPA1 and the second amplifier OPA2 are adjustable through the fifth resistor r1, the sixth resistor r2, the seventh resistor r3, the eighth resistor r4, the ninth resistor r5, the tenth resistor r6 and the eleventh resistor r7.

Optionally, the amplification factors of the first amplifier OPA1 and the second amplifier OPA2 are the same or different, so that the positive voltage sampling signal and the negative voltage sampling signal are within the detectable range of 0~5V of the MCU processing chip after being differential amplified.

The models of the first amplifier OPA1 and the second amplifier OPA2 can be the same, and the amplification factors can be adjusted separately, which can be the same or different.

In practical application, there may be more insulation resistors and more comparators to be added in the circuit to perform differential amplification on the sampling signals to realize insulation detection.

To sum up, the present application provides an insulation detection circuit for voltage balance. The existing resources of the MCU are reasonably used to design the insulation detection circuit for voltage balance. The positive pole and negative pole of the bus are connected with a common ground through the resistors with the total same resistance to realize voltage balance of the bus. By increasing the resistance of the insulation resistor, the insulation performance of the circuit is effectively guaranteed. At the same time, the proportional amplification resistor is added for the comparator to make the voltages of the insulation detection signals within the detectable range of the MCU chip and ensure the detection accuracy. At the same time, the real-time detection method is adopted to ensure the real-time safety and effectiveness of the system.

The terms "first" and "second" are only used for descriptive purposes and cannot be understood as indicating or implying relative importance or implying the number of indicated technical features. Thus, the features defined with "first" and "second" may explicitly or implicitly include one or more of the features. In the description of the present application, unless otherwise specified, "multiple" means two or more.

The above serial number of the embodiment of the present application is only for description and does not represent the advantages and disadvantages of the embodiment.

The above is only a preferred embodiment of the present application and is not intended to limit the present application. Any modification, equivalent replacement, improvement, etc. made within the spirit and principles of the present application shall be included in the scope of protection of the present application.

The invention claimed is:

1. An insulation detection circuit for voltage balance, comprising a bus battery, a bus positive voltage dividing circuit, a bus negative voltage dividing circuit, a differential amplification circuit and a micro controller unit (MCU) module;
wherein the bus battery is connected with the bus positive voltage dividing circuit and the bus negative voltage dividing circuit, the bus positive voltage dividing circuit and the bus negative voltage dividing circuit are connected with the differential amplification circuit, and the differential amplification circuit is connected with the MCU module;
the bus battery is configured for supplying power to the MCU module;
the bus positive voltage dividing circuit is configured for converting a positive voltage of the bus from a high voltage to a detectable low voltage;
the bus negative voltage dividing circuit is configured for converting a negative voltage of the bus from a high voltage to a detectable low voltage;
the differential amplification circuit is configured for sampling a voltage dividing signal, amplifying the sampled voltage dividing signal and transmitting the amplified voltage dividing signal to the MCU module; and
the MCU module is configured for an insulation detection of a bus;
wherein the bus battery comprises a battery, a first capacitor and a second capacitor, and the bus positive voltage dividing circuit comprises a first resistor and a second resistor, the bus negative voltage dividing circuit comprises a third resistor and a fourth resistor, and the differential amplification circuit comprises a first amplifier, a second amplifier, a fifth resistor, a sixth resistor, a seventh resistor, an eighth resistor, a ninth resistor, a tenth resistor and an eleventh resistor; and the MCU module comprises a MCU processing chip;
resistance values of the first resistor and the third resistor are the same; a resistance value of the second resistor is less than that of the first resistor, and a resistance value of the fourth resistor is less than that of the third resistor;
a positive pole of the battery is connected with a first terminal of the first capacitance and a first terminal of the first resistor, a negative pole of the battery is connected with a first terminal of the second capacitance and a first terminal of the third resistor, and a second terminal of the first capacitance is connected with a second terminal of the second capacitance, a first terminal of the second resistor, a first terminal of the fourth resistor, a first terminal of the fifth resistor, a first terminal of the tenth resistor and a first terminal of the eleventh resistor and grounded,
a second terminal of the first resistor is connected with a second terminal of the second resistor and a first terminal of the seventh resistor, a second terminal of the seventh resistor is connected with a non-inverting input terminal of the first amplifier, and a second terminal of the fifth resistor is connected with an inverting input terminal of the first amplifier and a first terminal of the sixth resistor, a second terminal of the sixth resistor is connected with an output terminal of the first amplifier and a first analog to digital converter port of the MCU processing chip, and a second terminal of the third resistor is connected with a second terminal of the fourth resistor and a first terminal of the ninth resistor, and
a second terminal of the ninth resistor is connected with an non-inverting input terminal of the second amplifier and a first terminal of the eighth resistor a second terminal of the eighth resistor is connected with a power supply, and a second terminal of the tenth resistor is connected with an inverting input terminal of the second amplifier, a second terminal of the eleventh resistor is connected with an output terminal of the second amplifier and a second analog to digital converter (ADC) port of the MCU processing chip.

2. The insulation detection circuit for voltage balance according to claim 1, wherein amplification factors of the first amplifier and the second amplifier are adjustable through the fifth resistor, the sixth resistor, the seventh resistor, the eighth resistor, the ninth resistor, the tenth resistor and the eleventh resistor.

3. The insulation detection circuit for voltage balance according to claim 2, wherein the amplification factors of the first amplifier and the second amplifier are the same or different, so that a positive voltage sampling signal and a negative voltage sampling signal are within a detectable range of the MCU processing chip after being differential amplified.

* * * * *